United States Patent
Lee et al.

(10) Patent No.: US 6,856,208 B2
(45) Date of Patent: Feb. 15, 2005

(54) MULTI-PHASE OSCILLATOR AND MULTI-PHASE OSCILLATION SIGNAL GENERATION METHOD

(75) Inventors: Zheng-Dao Lee, Chia-Yi County (TW); Oscal Tzyh-Chiang Chen, Chia-Yi County (TW); Robin Ruey-Bin Sheen, Chia-Yi County (TW)

(73) Assignee: National Chung Cheng University, Chia-Yi (TW)

( * ) Notice: Subject to any disclaimer, the term of this patent is extended or adjusted under 35 U.S.C. 154(b) by 0 days.

(21) Appl. No.: 10/063,835

(22) Filed: May 17, 2002

(65) Prior Publication Data

US 2003/0137358 A1 Jul. 24, 2003

(30) Foreign Application Priority Data

Jan. 21, 2002 (TW) ........................................ 91100850 A

(51) Int. Cl.[7] .............................................. H03B 27/00
(52) U.S. Cl. ............................ 331/55; 331/57; 331/172
(58) Field of Search .............................. 331/45, 47, 55, 331/57, 153, 172, 175, 2, 1 A, 177 R

(56) References Cited

U.S. PATENT DOCUMENTS

| | | | | |
|---|---|---|---|---|
| 5,018,169 A | * | 5/1991 | Wong et al. | 375/373 |
| 5,302,920 A | * | 4/1994 | Bitting | 331/45 |
| 5,563,554 A | * | 10/1996 | Mizuno | 331/57 |
| 5,592,127 A | * | 1/1997 | Mizuno | 331/57 |
| 6,188,291 B1 | * | 2/2001 | Gopinathan et al. | 331/45 |

* cited by examiner

*Primary Examiner*—Minh Nguyen
(74) *Attorney, Agent, or Firm*—Jiang Chyun IP Office

(57) ABSTRACT

The invention provides a multi-phase oscillator includes a delay loop buffer and plurality of oscillators. The delay loop buffer has N delay units. The oscillator can be a single phase oscillator, a 180° phase difference oscillator or a multiple phase difference oscillator. The N delay units are used to constitute a configuration having 360° phase shift where each delay unit has the same delay time and phase shift. Furthermore, a 180° phase difference oscillator composed of a plurality of inverters and a regenerator can be applied in the multi-phase oscillator.

9 Claims, 16 Drawing Sheets

MULTI-PHASE OSCILLATOR AND MULTI-PHASE OSCILLATION SIGNAL GENERATION METHOD

CROSS REFERENCE TO RELATED APPLICATIONS

This application claims the priority benefit of Taiwan application serial no. 91100850, filed Jan. 21, 2002.

BACKGROUND OF INVENTION

1. Field of Invention

The present invention generally relates to an oscillator and an oscillation signal generation method, and more particularly, to a multi-phase oscillator and a multi-phase oscillation signal generation method.

2. Description of Related Art

The oscillator plays a very important role in both communication systems and digital circuits now. In digital circuits, the oscillator provides multi-phase clock signals to the system. In communication systems, the multi-phase oscillation output of the oscillator can be used as a carrier in the modulation operation or as a local oscillator in the demodulation operation.

Generally speaking, there are two major methods to design the oscillator: (1) using the LC charge-discharge circuit that consists of an inductor (L) and a capacitor (C); (2) connecting an odd number of the inverters in serial to generate an oscillation signal by the contribution of the time delay in between the inverters. Recently, along with the great progress of the CMOS manufacture process, and also considering of the system integrity, the design method that includes the inductor elements is seldom used because the Q value cannot be increased and a great area is required for the on-chip inductor. The researches of the multi-phase output method mostly concentrate on the study of the outputs have a 180° or a 90° phase difference.

The configuration having a 180° phase difference is shown in FIG. 1, FIG. 1 schematically shows a circuit diagram of a conventional regeneration ring oscillator (please refer to T. Kwasniewski et al., "Inductorless oscillator design for personal communication device a 1.2 um CMOS process case study," Proc. of IEEE Custom Integrated Circuit Conference, pp 327–330, 1995 and M. Thamsirianunt and T. A. Kwasniewski, "CMOS VCO"s for PLL frequency synthesis in GHz digital mobile radio communications," IEEE journal of Solid-State Circuits, vol. 32, no. 10, pp. 1511–1524, October 1997.). Each of the inverter latches using a two-stage regenerator 102, 104, is connected with the ring oscillator that consists of two sets of the three-stage inverters (such as 106, 108, 110 and 112, 114, 116 as shown in FIG. 1) that are coupled each other to generate the oscillation signals. The two-stage regenerators 102 and 104 of the present configuration provide the energy to the ring oscillator that consists of the three-stage inverters that consists of the inverters connected in series, so that the oscillator 100 obtains a lower phase noise. However, the more elements it uses result in greater time delay and larger power consumption.

The first configuration having a 90° phase difference is shown in FIG. 2, FIG. 2 schematically shows a circuit diagram of a conventional RC-CR oscillator having a 90° phase difference (please refer to Qiuting Huang, "The design of a direct-conversion paging receiver quadrature converter for wrist watch application electronics," Proc. of IEEE International Conference on Circuits and Systems, vol.3, pp 29–32, 1998.). It is a system configuration consists of a single resistor capacitor-capacitor resistor (RC-CR). Although the RC-CR configuration can achieve the function of outputting a 90° phase difference signal, since each of the RC-CR in the configuration is coupled to the input nodes of the differential configuration, the distortion is easily occurred due to the mismatch of the input nodes.

The second configuration having a 90° phase difference is shown in FIG. 3. FIG. 3 schematically shows a circuit diagram of a conventional ring oscillator that generates a 90° phase difference (please refer to Chung-Yu Wu and Hong-Sing Kao, "A 1.8 GHz CMOS quadrature voltage-controlled oscillator (VCO) using the constant-current LC ring oscillator structure," Proceedings of the 1998 IEEE International Symposium on Circuits and Systems vol. 4, pp. 378–381, 1998.). It utilizes a two-stage LC tank that consists of an inductor and a capacitor connected in serial and the negative resistance circuit to obtain the oscillation signals on the nodes I and Q.

The third configuration having a 90° phase difference is shown in FIG. 4. FIG. 4 schematically shows a circuit diagram of a conventional ring oscillator that consists of a six-stage differential amplifier including six differential amplifiers connected in serial (please refer to Y. Sugimoto and T. Ueno, "The design of 1 V, 1 GHz CMOS VCO circuit with in-phase and quadrature-phase output," Proceedings of IEEE International Symposium on Circuits and Systems vol.1, pp. 269–272, 1997.). It utilizes three currents that are generated by the first, the third and the fifth differential amplifiers to generate the outputs having a 90 phase difference, and to obtain the expected oscillation signals on the nodes I and Q. However, the present method easily results in an oscillation signal error due to the mismatch of the three output currents that have a 120° phase difference.

FIG. 5 schematically shows a circuit diagram of a conventional ring oscillator that consists of a four-stage differential amplifier (please refer to U.S. Pat. No. 5,635,880). It utilizes the microwave theory of the differential amplifier to appropriately adjust the circuit bias. In this circuit, the Miller effect is used to constitute a RC loop to configure a ring oscillator circuit that consists of a four-stage differential amplifier to generate multi-phase oscillation signals.

FIG. 6 schematically shows a circuit diagram of a conventional ring oscillator that consists of branch feedback loops (please refer to U.S. Pat. No. 6,075,419). The proper branch feedback loops are added to the ring oscillator consisting of the inverters that are connected in serial, so that the output signals are evenly feedback applied to each input node of the serially connected oscillator to generate the multi-phase oscillator signals.

FIG. 7 schematically shows a circuit diagram of the conventional injection phase locked oscillation signal generator (please refer to U.S. Pat. No. 6,188,291). It uses two or more than two serially connected ring oscillators having the same time period to generate and output the signals. The total phase 360° is formed by the serially connected ring oscillator that generates a phase difference having the same degree. It is based on the theory that a set of the oscillation signals is injected to lock another set of the signals, so that the expected phase difference can be obtained efficiently. Moreover, the present configuration also reduces the phase noise by adding a periodic low noise oscillation signal source 702.

The cases shown in FIG. 5 through FIG. 7 mentioned above are all the multi-phase oscillators. However, they can only provide the oscillation signals with limited varieties of the phase differences.

SUMMARY OF INVENTION

Therefore, the present invention provides a multi-phase oscillator to output the oscillation signals having a phase difference of any degree. Fewer elements are used to save the power consumption. Furthermore, the output mismatch is avoided, so that the precision of the phase difference of the output oscillation signal can be relatively increased.

The present invention provides a multi-phase oscillator, comprising a delay loop buffer and a plurality of oscillators. The delay loop buffer has N units of the delay unit, the output node of the first delay unit is electrically coupled to the input node of the second delay unit, the output node of the second delay unit is electrically coupled to the input node of the third delay unit, . . . , the output node of the $N^{th}$ delay unit is electrically coupled to the input node of the first delay unit. Moreover, since the N units of the delay unit constitute a 360° phase shift mesh configuration, the time delay of each delay unit has equal size and is divided from a 360° phase. So that the oscillation signals generated by the oscillators have a phase difference that is divided from a 360° phase and is not variable. Furthermore, the plural oscillators provide the plural oscillation signals to the delay loop buffer, the N units of the delay unit are used to evenly divide a 360° phase, so that the oscillation signals generated by the oscillators have a phase difference that is divided from a 360° phase and is not variable.

The present invention further provides an oscillator having a 180° phase difference. The oscillator comprises a first oscillation signal output terminal and a second oscillation signal output node and the oscillator is composed of a plurality of inverters and a regenerator. The output node of the first inverter is electrically coupled to the first oscillation signal output node, the input node of the second inverter is electrically coupled to the second oscillation signal output node; the output node of the second inverter is electrically coupled to the input node of the first inverter; the input node of the third inverter is electrically jointly coupled to the output node of the first inverter and the first oscillation signal output node; the input node of the fourth inverter is electrically coupled to the output node of the third inverter, the output node of the fourth inverter is electrically jointly coupled to the input node of the second inverter and the second oscillation signal output node; the first electrode of the regenerator is electrically jointly coupled to the output node of the first inverter, the input node of the third inverter and the first oscillation signal output node; the second electrode of the regenerator is jointly coupled to the input node of the second inverter, the output node of the fourth inverter and the second oscillation signal output node; the regenerator is used to generate a 180° phase difference on its both electrodes. Wherein, the regenerator further comprises a fifth inverter and a sixth inverter, the input node of the fifth inverter is electrically coupled to the first oscillation signal output node, the output node of the fifth inverter is electrically coupled to the second oscillation signal output node; the input node of the sixth inverter is electrically jointly coupled to the output node of the fifth inverter and the second oscillation signal output node, the output node of the sixth inverter is electrically jointly coupled to the input node of the fifth inverter and the first oscillation signal output node.

Moreover, the present invention further provides a multi-phase oscillation signal generation method. The method evenly divides a fixed phase into multiple corresponding equal size portions by using plural delay times that have the same length of time. Afterwards, the multiple independent oscillation sources respectively provide the driving signal to each equal size portion.

In an embodiment of the present invention, each oscillation source must provide a driving signals to more than two equal size portions simultaneously. Wherein, the driving signal output from any of the oscillation sources can be generated by an oscillator or multiple oscillators in a multi-level structure. In the other case, as for the other embodiment of the present invention, the driving signal received by any equal size portion is generated by a hierarchical level configuration. In this level configuration, the most upper level oscillation source provides the oscillation signals to the equal size portions. Furthermore, the upper level oscillation source is driven by the plural lower-level oscillation sources simultaneously.

Therefore, the multi-phase oscillator provided by the present invention is able to output the oscillation signals having a phase difference of any degree. Fewer elements are used to save the power consumption. Furthermore, the output mismatch is avoided, so that the precision of the phase difference of the output oscillation signals can be relatively increased.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a circuit diagram of the conventional regeneration ring oscillator.

DETAILED DESCRIPTION

Figure 8:
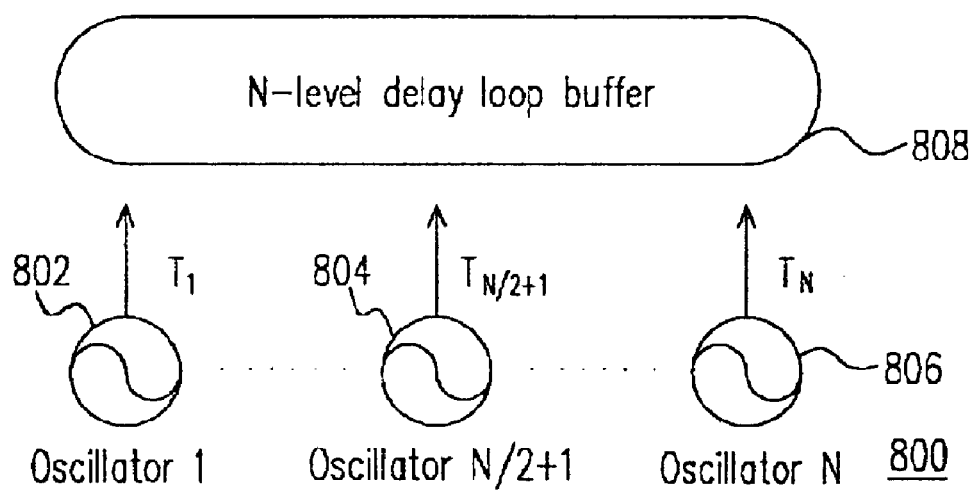
FIG. 8 schematically shows a sketch map of the multi-phase oscillator of the present invention.

Please refer to FIG. 8, FIG. 8 schematically shows a sketch map of the multi-phase oscillator of the present invention. In FIG. 8, the multi-phase oscillator 800 comprises a N-level delay loop buffer 808 and N single-phase oscillators (such as 802, 804, 806 shown in FIG. 8). The delay loop buffer 808 that has N-level RC time constants, is able to generate the phase difference in between the oscillation signals, and to constitute a mesh configuration having a 360° phase shift via the N units of the delay unit (not shown in the diagram) loop that are connected in serial inside the delay loop buffer 808. Since each delay unit has the same length of the delay time, it means each of the two contiguous delay units has a phase difference that is 360°/N and is not variable. The oscillation signals (such as $T_1$, $T_{N/2+1}$, $T_N$ shown in FIG. 8) generated by the N units of the oscillator (such as 802, 804, 806 shown in FIG. 8) are input into the delay loop buffer 808. When the whole circuit comes to a steady state, the oscillation signals generated by the N units of the oscillator have a fixed phase difference on each other. Moreover, this phase difference is the same as the phase difference formed by the delay loop buffer 808, so that the function of outputting the multi-phase oscillation signal can be achieved.

Figure 9A:
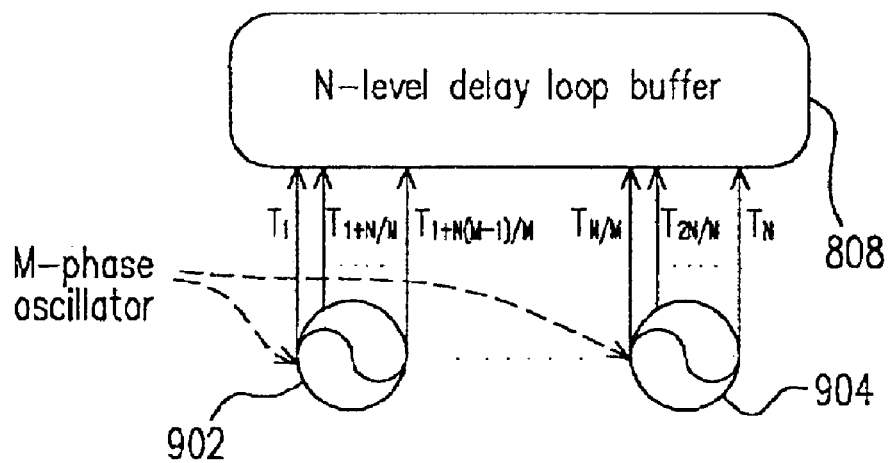
FIG. 9A schematically shows a sketch map of the configuration of a preferred embodiment of the multi-phase oscillator driven by the oscillation signals having multiple phase differences according to the present invention.

The present invention further provides a configuration that is driven by the oscillation signals having more phases, FIG. 9A schematically shows a sketch map of the configuration of the multi-phase oscillator driven by the oscillation signals having multiple phase differences according to the present invention. The oscillator 902, 904 that have a precise 360°/M phase difference are electrically coupled to the N-level delay loop buffer 808, each oscillator 902,904 has M units of the oscillation signal output, and the outputs of the oscillator 902 are electrically coupled to the $1^{st}$, the $(1+N/M)^{th}$, . . . , the $[1+N(M-1)/M]^{th}$ delay unit by the $T_j$, $T_{1+N/M}$, $T_{1+N(M-1)/M}$ driving signal respectively. Since each position with interval of N/M is precisely set to have a 360°/M phase difference, number of the oscillators to trigger the delay loop buffer 808 is reduced from the original N to N/M. Therefore, the time needed to reach the steady state for the whole circuit is reduced comparing with the signal triggering scheme. The design also successfully enhances the performance of the multi-phase oscillator. Consequently, the configuration of FIG. 9 can be extended continuously to generate and output the oscillation signals having more phases.

Figure 9B:
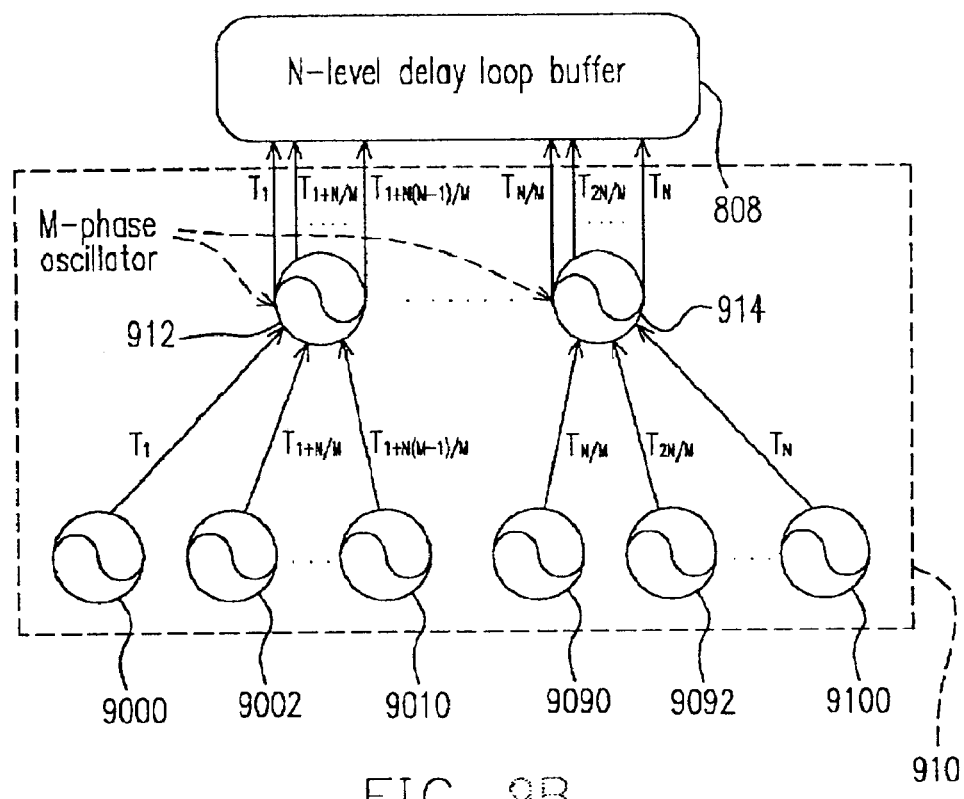
FIG. 9B schematically shows a sketch map of the configuration of another preferred embodiment of the multi-phase oscillator driven by the oscillation signals having multiple phase differences according to the present invention.
Figure 9C:
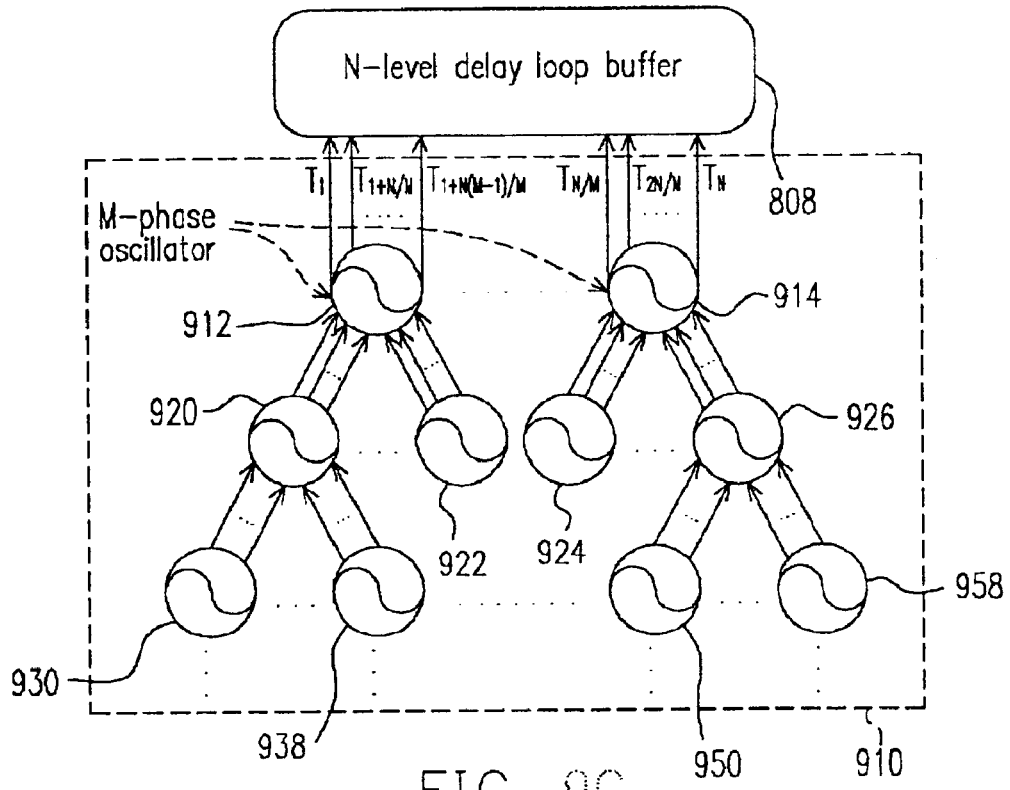
FIG. 9C schematically shows a sketch map of the configuration of another preferred embodiment of the multi-phase oscillator driven by the oscillation signals having multiple phase differences according to the present invention.

Moreover, the embodiment of the present invention is further described via FIG. 8, FIG. 9A and FIG. 9B herein. First, as shown in FIG. 8, the N-level delay loop buffer uses a phase difference value as the basis to divide a specific fixed phase (such as 360° shown in these two diagrams) into N portions. Then, in the present embodiment, the output of each buffer (i.e. each equal size portion) is in charged by each oscillator. In other words, in the present embodiment, the oscillation signal output from each equal size portion is provided by an oscillator (one of the oscillators from 802 to 806).

However, in another embodiment such as the one shown in FIG. 9A, the situation is not as simple as this. In FIG. 9A, similarly, the N-level delay loop buffer uses a phase difference value as the basis to divide a specific fixed phase (such as 360 shown in FIG. 9A) into N portions. Since the oscillation source (oscillators 902–904) may generate M units of the oscillation signal, the difference between these two embodiments is that there are only NIM oscillators in the present embodiment. Therefore, as shown in FIG. 9A, the M-phase oscillator is used as the oscillation source in the present embodiment. However, this is not the only method we can use. As shown in FIG. 9B, the driving signal provided to the N-level delay loop buffer 808 are generated by a level configuration 910. In the level configuration 910, the most upper level oscillation sources 912–914 are still in charge of providing the driving signals to the N-level delay loop buffer 808. However, the driving signal source of each oscillation source is generated by the multiple lower level oscillation sources. For example, in FIG. 9B, the lower level oscillation sources 9000–9010 provide the driving signals to the upper level oscillation source 912, and the lower-level oscillation sources 9090–9100 also provide the driving signals to the corresponding upper level oscillation source 914. Of course, those who are skilled in the related art should understand the multi-level configuration is not limited by the two-level as shown in FIG. 9B, it can be any number of the levels such as the one shown in FIG. 9C. The spirit is as long as the oscillation signals output from the upper level oscillation source driven by the multiple lower level oscillation sources. That is, the driving signals of the upper level oscillation source 912 (it is the most upper level oscillation source in the present embodiment) are provided by the lower level oscillation sources 920–922, and the driving signals of the oscillation source 914 are provided by the lower-level oscillation sources 924–926. With consideration of the lower-level oscillation sources 930–938, the oscillation source 920 is the corresponding upper-level oscillation source. Therefore, the driving signal input by the oscillation source 920 are provided by the oscillation sources 930–938. Similarly, the driving signal input by the oscillation source 926 are provided by the oscillation sources 950–958.

Figure 10:
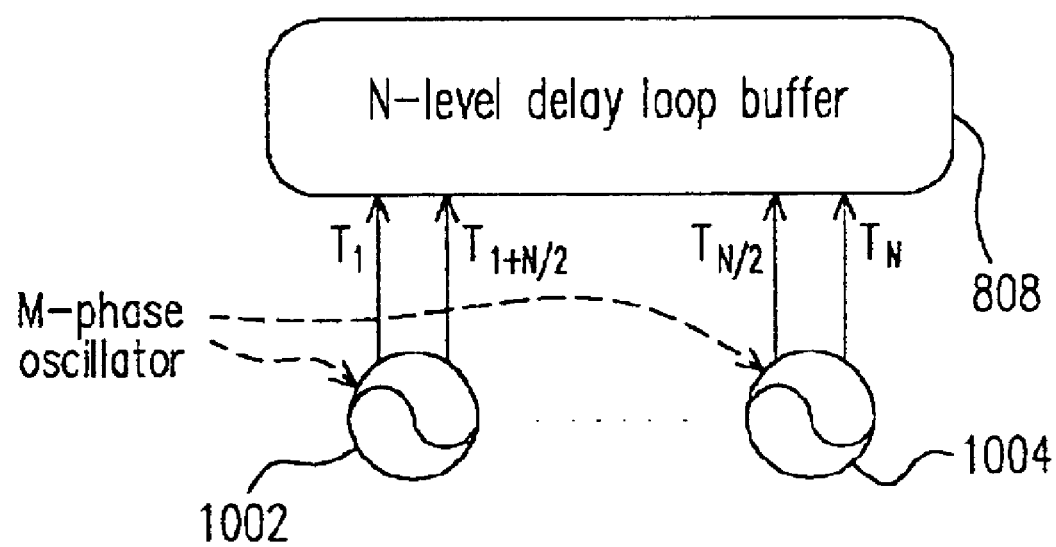
FIG. 10 schematically shows a sketch map of the multi-phase oscillator driven by the oscillation signals having a 180° phase difference according to the present invention.

In order to understand the performance of the multi-phase oscillator more easily, the oscillator having a 180° phase difference is exemplified herein, its output oscillation signals are used as the driving signals to drive the N-level delay loop buffer 808. FIG. 10 schematically shows a sketch map of the multi-phase oscillator driven by the oscillation signals having a 180° phase difference according to the present invention. As shown in FIG. 10, the oscillators 1002, 1004 that have output signals with a precise 180° phase difference are electrically coupled to the N-level delay loop buffer 808. Each oscillator 1002, 1004 has two sets of the oscillation signal outputs, where the 0° output of the oscillator 1002 is electrically coupled to the first delay unit (not shown in the diagram) to be a driving signal $T_1$, the 180° output of the oscillator 1002 is electrically coupled to the $(1+N/2)^{th}$ delay unit (not shown in the diagram) to be a driving signal $T_{1+N/2}$. Any two positions in the entire circuit with the interval of N/2 delay units are precisely set to have a 180° phase difference. The number of the oscillators required in the delay loop buffer 808 that needs to be adjusted is reduced to a half of the original number. Therefore, the time needed to reach the steady state for the entire circuit is reduced comparing with the single phase signal driving method.

Figure 11:
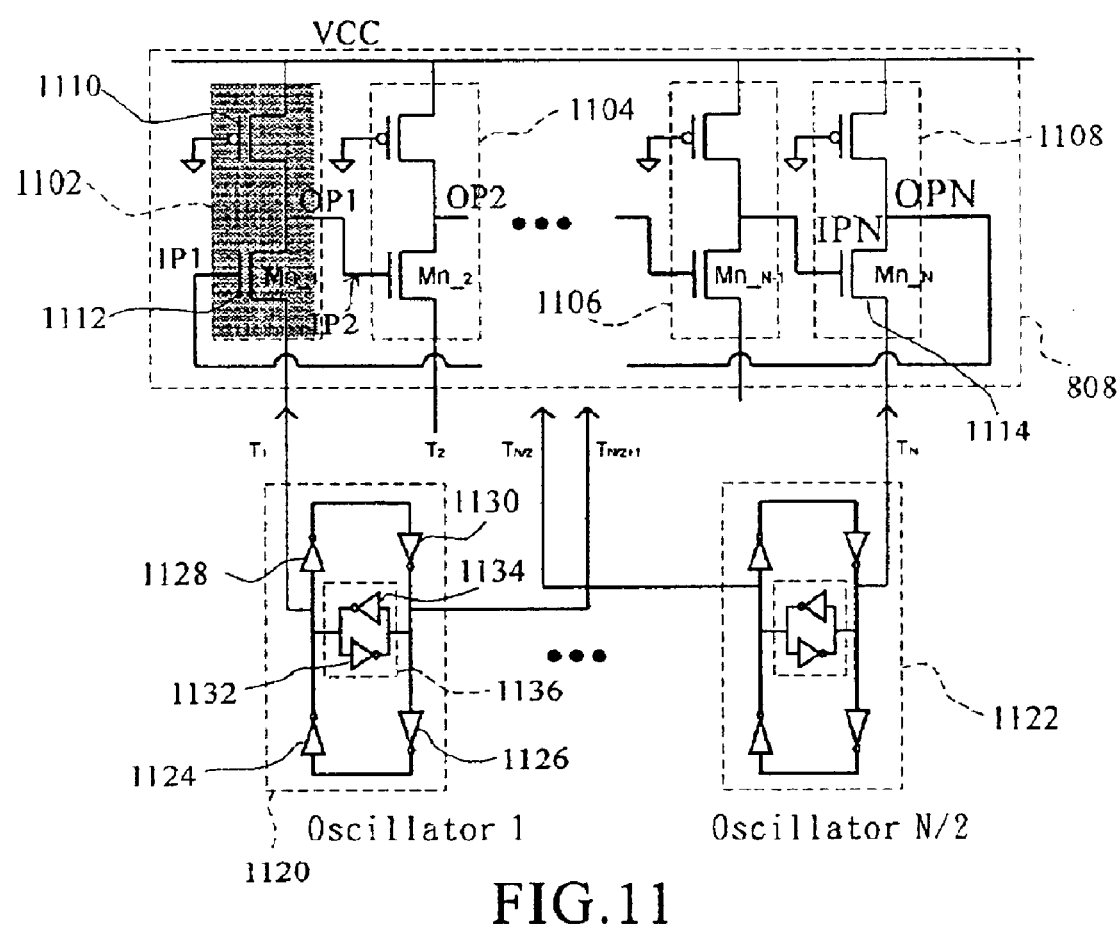
FIG. 11 schematically shows a circuit diagram of the multi-phase oscillator that consists of a 180° phase difference oscillator and a delay loop buffer.

FIG. 11 schematically shows a circuit diagram of the multi-phase oscillator that consists of a 180° phase differences oscillator and a delay loop buffer. In FIG. 11, the N-level delay loop buffer 808 has N units of the delay unit 1102, 1104, 1106, 1108. The output node OP1 of the delay units 1102 is electrically coupled to the input node IP2 of the delay unit 1104, the output node OP2 of the delay unit 1104 is electrically coupled to the input node IP3 of the next delay unit (not shown in the diagram), the output node OPN of the delay unit 1108 is electrically coupled to the input node IP1 of the delay unit 1102. The N units of the delay units 1102, 1104, 1106, 1108 constitute a mesh configuration having a 360 phase shift. Every delay unit has the same delay time and phase shift. The expected neighboring oscillation signals having a 360°/N phase difference can be obtained. Each delay unit is composed of a PMOS and a NMOS. The delay unit 1102 is exemplified herein, the source of the PMOS 1110 is electrically coupled to the power supply VCC, the gate of the PMOS 1110 is coupled to the ground, and the drain of the PMOS 1110 is electrically coupled to the output node OP1 of the delay unit 1102; the drain of the NMOS 1112 is electrically jointly coupled to the drain of the PMOS 1110 and the output node OP1 of the delay unit 1102, the gate of the NMOS 1112 is electrically coupled to the input node IP1 of the delay unit 1102, the source of the NMOS 1112 is electrically coupled to the oscillation signal $T_1$ output node of the oscillator 1120. The connection layouts of the other delay units such as 1104, 1106, 1108 are similar to that of the layout of the delay unit 1102.

In FIG. 11, the plural NMOS of the Mn_1 1112~Mn_N 1114 that are in the delay unit 1102, 1104, 1106, 1108 and connected to the oscillator 1120, 1122 are used to adjust the operation of the oscillator 1120, 1122. The NMOS itself is not in the loops of oscillators, so that the output frequencies of the oscillators 1120, 1122 are not impacted. Therefore, there is a better isolation effect between the oscillation signal generation and the phase shift control, so that the quality of the oscillation signals can be improved.

In FIG. 11, the oscillator 1120, 1122 provides the oscillation signals to the delay loop buffer 808. The N units of the delay unit 1102, 1104, 1106, 1108 are used to evenly divide a 360° phase, so that the neighboring oscillation signals generated by the oscillator 1120, 1122 have the same phase difference. The oscillator 1120, 1122 uses the new circuit configuration that is composed of six inverters. The oscillator 1120 is exemplified herein, the output node of the inverter 124 is electrically coupled to the oscillation signal $T_1$ output node of the oscillator 1120; the input node of the inverter 1126 is electrically coupled to the oscillation signal $T_{1+N/2}$ output node of the oscillator 1120; the output node of the inverter 1126 is electrically coupled to the input node of the inverter 1124; the input node of the inverter 1128 is electrically jointly coupled to the output node of the inverter 1124 and the oscillation signal $T_1$ output node of the oscillator 1120; the input node of the inverter 1130 is electrically coupled to the output node of the inverter 1128, the output node of the inverter 1130 is electrically jointly coupled to the input node of the inverter 1126 and the oscillation signal $T_{1+N/2}$ output node of the oscillator 1120; the first electrode of the regenerator 1136 is electrically jointly coupled to the output node of the inverter 1124, the input node of the inverter 1128 and the oscillation signal $T_1$ output node of the oscillator 1120; the second electrode of the regenerator 1136 is electrically jointly coupled to the input node of the inverter 1126, the output node of the inverter 1130 and the oscillation signal $T_{1+N/2}$ output node of the oscillator 1120; the regenerator 1136 is used to generate a 180° phase difference on its both electrodes. Wherein, the regenerator 1136 is composed of an inverter 1132 and an inverter 1134. The input node of the inverter 1132 is electrically coupled to the oscillation signal $T_1$ output node of the oscillator 1120, the output node of the inverter 1132 is electrically coupled to the oscillation signal $T_{1+N/2}$ output node of the oscillator 1120; the input node of the inverter 1134 is electrically jointly coupled to the output node of the inverter 1132 and the oscillation signal $T_{1+N/2}$ output node of the oscillator 1120, the output node of the inverter 1134 is electrically jointly coupled to the input node of the inverter 1132 and the oscillation signal $T_1$ output node of the oscillator 1120. The connection layout of the other oscillator such as oscillator 1122 is similar to the layout of the oscillator 1120.

Figure 1:
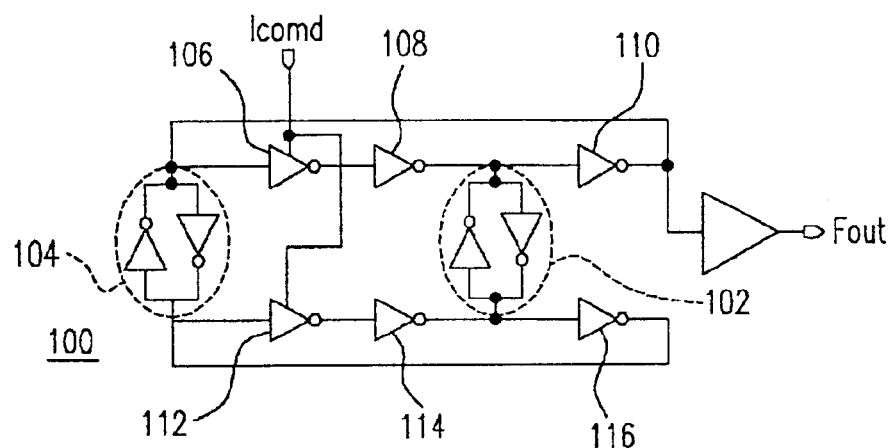
Figure 2:
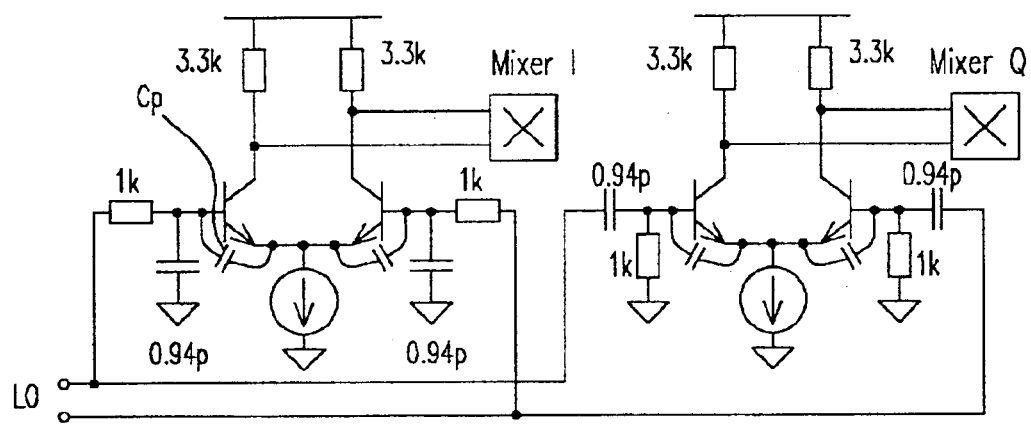
FIG. 2 schematically shows a circuit diagram of the conventional RC-CR oscillator having a 90° phase difference.
Figure 3:
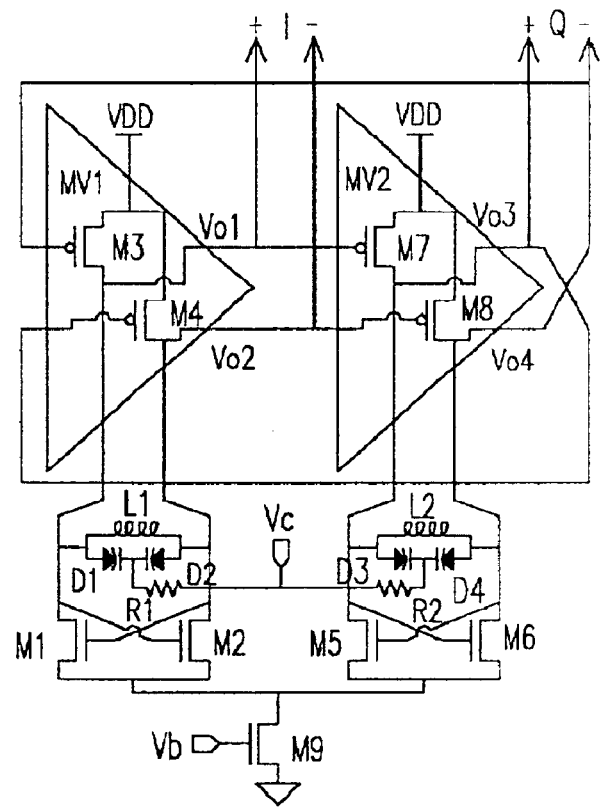
FIG. 3 schematically shows a circuit diagram that uses the conventional ring oscillator to generate signals having a 90° phase difference.
Figure 4:
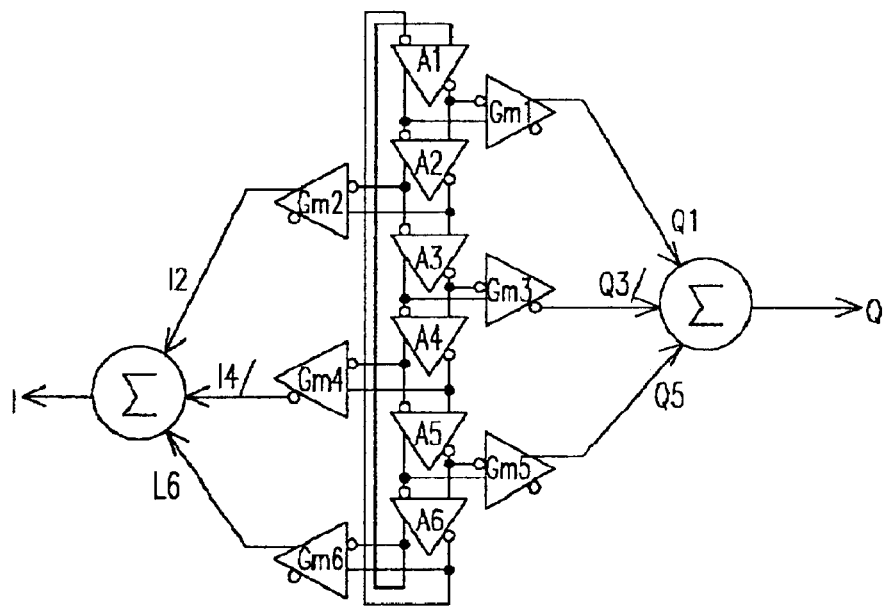
FIG. 4 schematically shows a circuit diagram of the conventional circular oscillator that includes a six-stage differential amplifier that consists of six differential amplifiers connected in serial.
Figure 5:
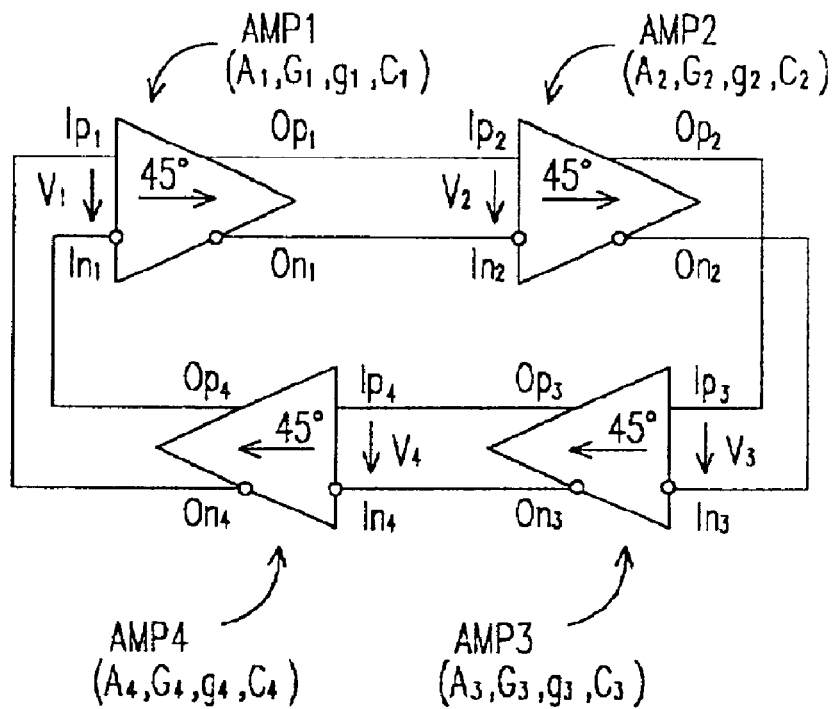
FIG. 5 schematically shows a circuit diagram of the conventional ring oscillator that consists of a four-stage differential amplifier.
Figure 6:
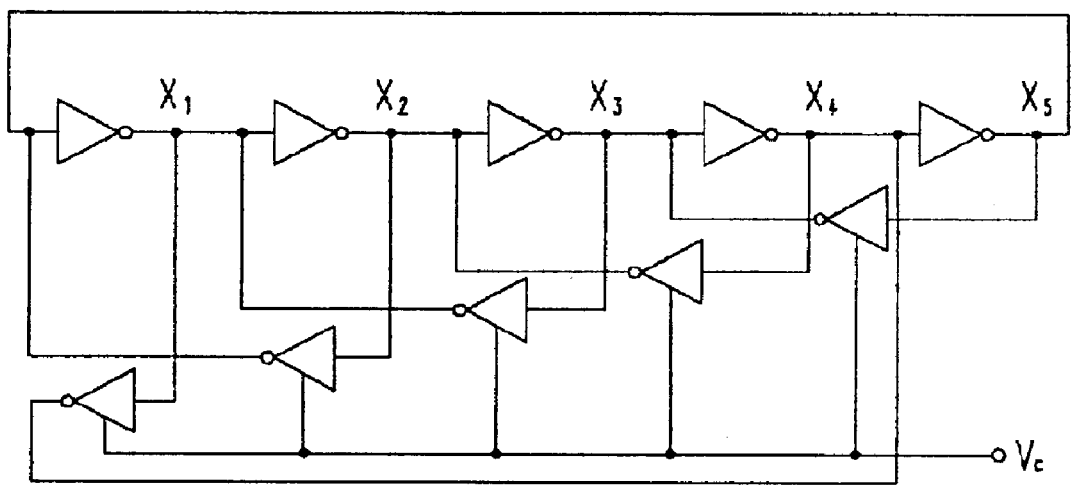
FIG. 6 schematically shows a circuit diagram of the conventional ring oscillator that consists of a branch feedback loops.
Figure 7:
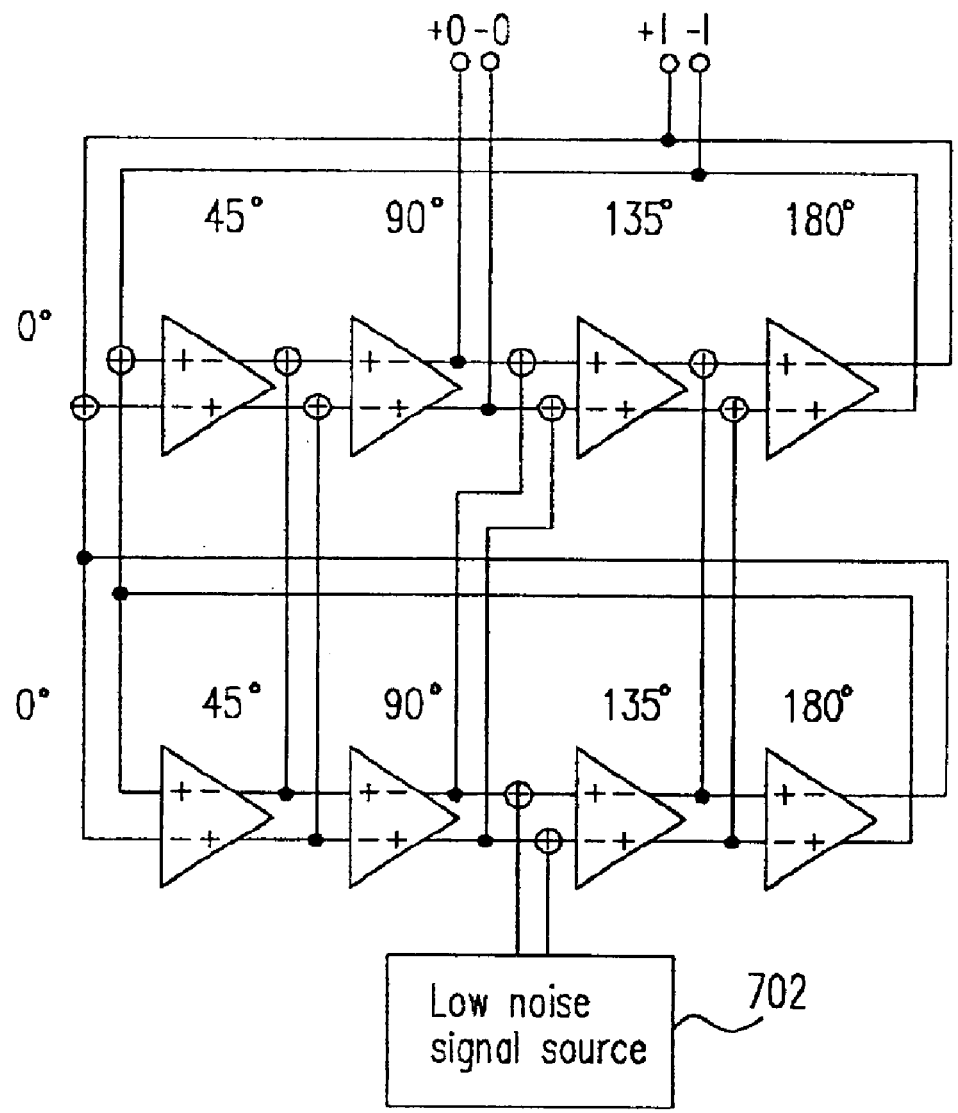
FIG. 7 schematically shows a circuit diagram of the conventional injection phase locked oscillation signal generator.
Figure 12A:
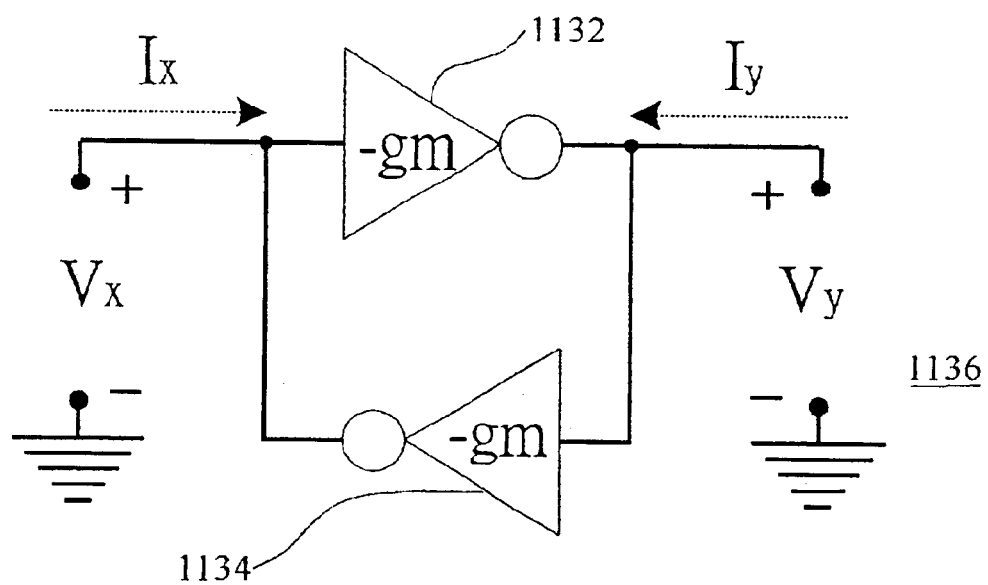
FIG. 12A schematically shows a dual-port circuit diagram of the regenerator current configuration.

As for using the regenerator to constitute an oscillator having a 180° phase difference, in comparison with the oscillator in FIG. 1, the oscillator 1120 shown in FIG. 11 uses fewer elements and outputs higher frequency oscillation signals. The regenerator 1136 uses the equivalent capacitors (not shown in the diagram) of the transistors inside the inverter 1132, 1134 and two adjustable transconductors (not shown in the diagram) that have the same specification and are jointly coupled together to constitute a feedback configuration. FIG. 12A schematically shows a dual-port circuit diagram of the regenerator current configuration. The regenerator 1136 works as a gyroscope, therefore, the transition matrix of the regenerator 1136 can be represented as following equation:

$$\begin{bmatrix} I_x \\ I_y \end{bmatrix} = \begin{bmatrix} 0 & -gm \\ -gm & 0 \end{bmatrix} \begin{bmatrix} V_x \\ V_y \end{bmatrix}.$$

Figure 12B:
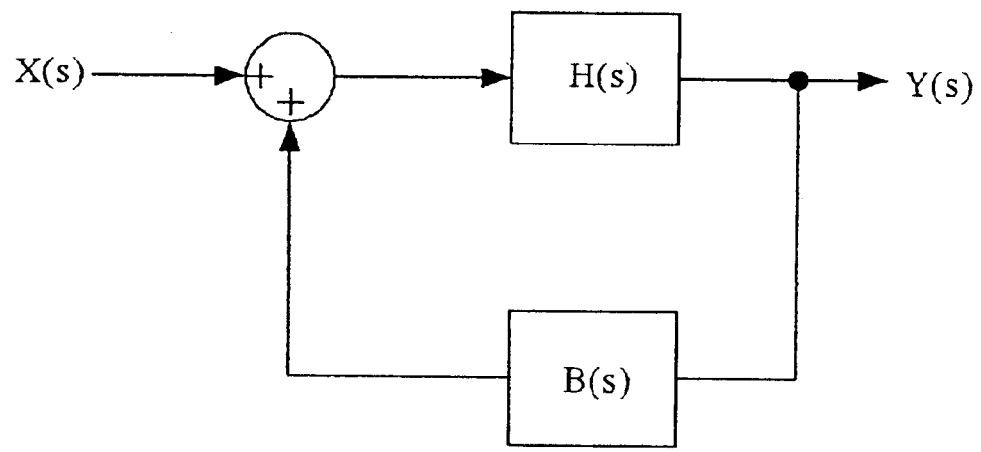
FIG. 12B schematically shows a two-stage feed-feeding block diagram of the regenerator.
Figure 12C:
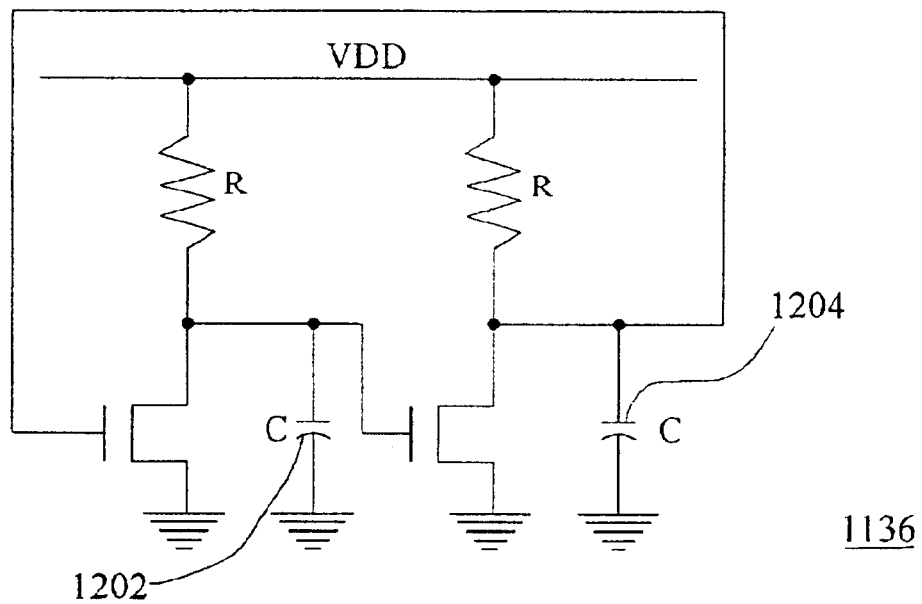
FIG. 12C schematically shows an equivalent circuit diagram of FIG. 12B.
Figure 12D:
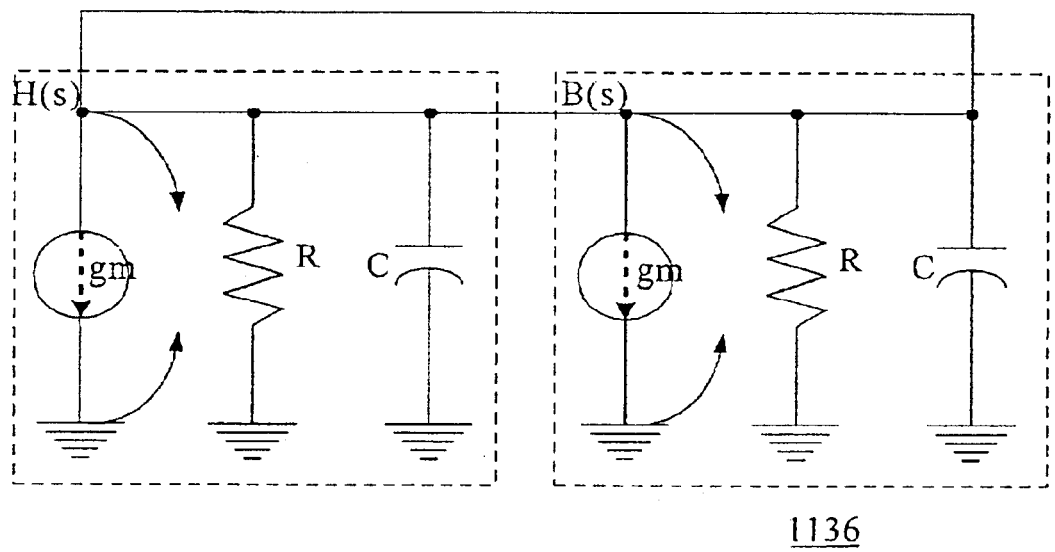
FIG. 12D schematically shows a small signal equivalent circuit diagram of FIG. 12C.

In the configuration of the new fashion 180° phase difference oscillator, the delay time elements (not shown in the diagram) of the inverter 1132, 1134 are used to constitute a two-stage self-feeding circuit as shown in FIG. 12B. FIG. 12C schematically shows an equivalent circuit diagram of FIG. 12B. From FIG. 12B and FIG. 12C, the regenerator 1136 can be treated as a two-stage ring unit having the equivalent capacitor C 1202 and 1204. FIG. 12D schematically shows a small signal equivalent circuit diagram of FIG. 12C. The open loop transfer function and the gain equation of the regenerator 1136 can be obtained from FIG. 12D, as follows:

$$T(j\omega) = \left(\frac{-gmR}{1+j\omega RC}\right)^2$$

$$H(j\omega) = \frac{\frac{-gmR}{1+j\omega RC}}{1-\left(\frac{-gmR}{1+j\omega RC}\right)^2}$$

From the equations mentioned above, the phase of the circuit proposed by FIG. 12A through FIG. 12D can be obtained as following equations:

Phase$(V_x-V_y)=\pm(2k+1)\pi$  $k$ is a positive integer

Phase$\left[\left(\frac{-gmR}{1+j\omega RC}\right)^2\right] = 2k\pi$  $k$ is a positive integer From the equations mentioned above, the signals output from two terminals of the regenerator 1136 have an exactly 180° phase difference.

Figure 13A:
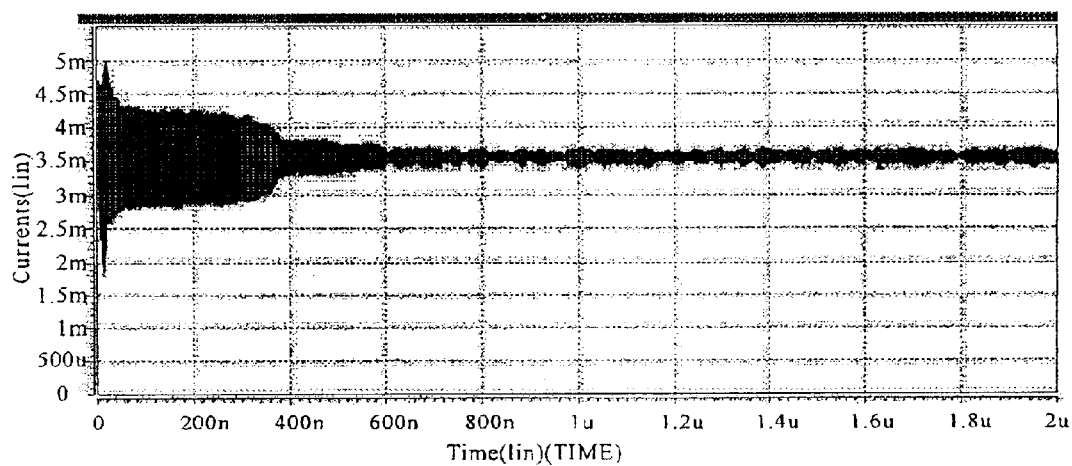
FIG. 13A schematically shows the simulation result of the oscillator driven by a single phase oscillation signals.
Figure 13B:
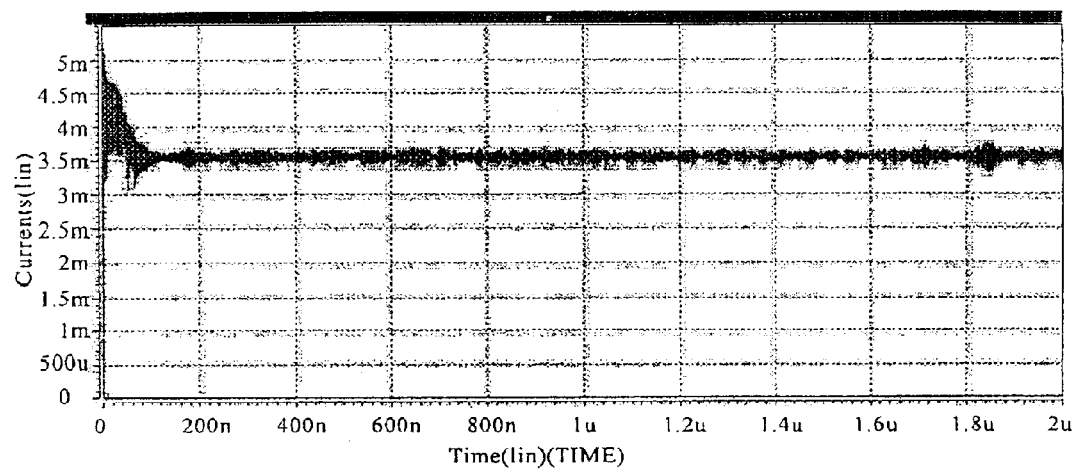
FIG. 13B schematically shows the simulation result of the oscillator driven by the two-phase oscillation signals having a 180° phase difference.

The output oscillation signals having different phase are used as the oscillation signal sources to address multiple-phase generation unit that is the delay loop buffer. FIG. 13A schematically shows the simulation result of the 45° phase generation unit, the current waveform is changed from a great current variation when the output oscillation signal dose not come to a stable condition when the output oscillation signal comes to the steady state. FIG. 13B schematically shows the simulation result of the 45° phase generation unit driven by the two-phase oscillation signals in which each pair has a 180° phase difference. FIG. 13B schematically shows the variation of the current waveform from the initial state to the steady state when each pair of the signals having a 180° phase difference are input into the phase generation unit. From FIG. 13A and FIG. 13B, if the oscillation signals having a stable multiple phases can be used as the driving signals to address the phase generation unit, the time needed for the oscillator to come to a steady state can be reduced.

Figure 14:
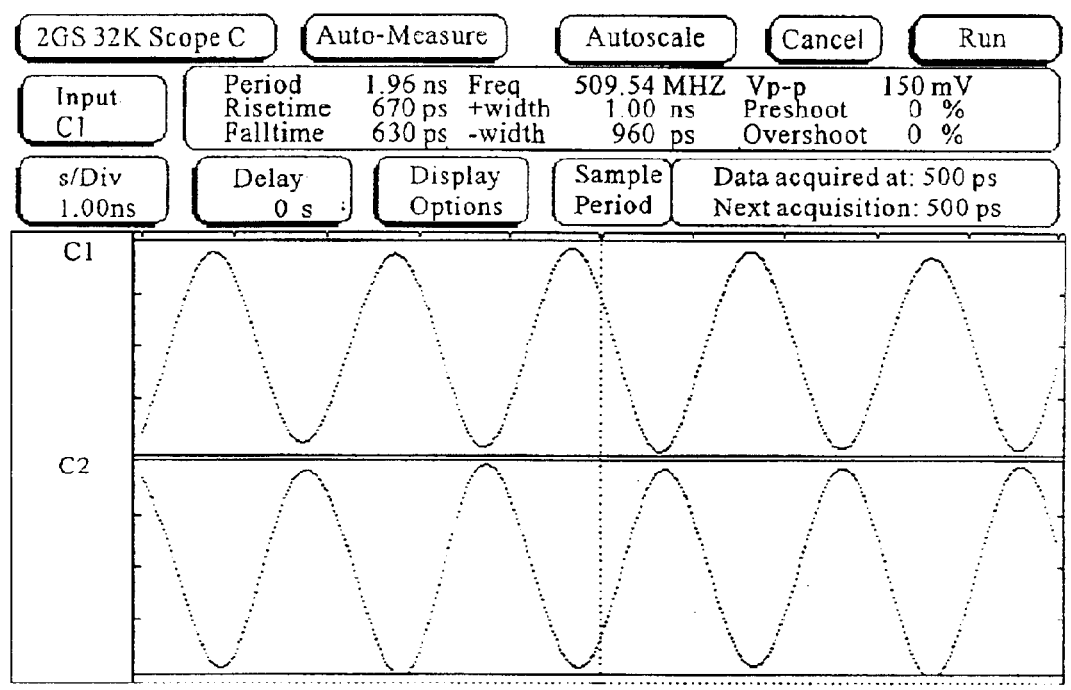
FIG. 14 schematically shows the measured waveforms of the oscillator having a 180° phase difference from the manufacture process of TSMC 0.35 um CMOS.
Figure 15:
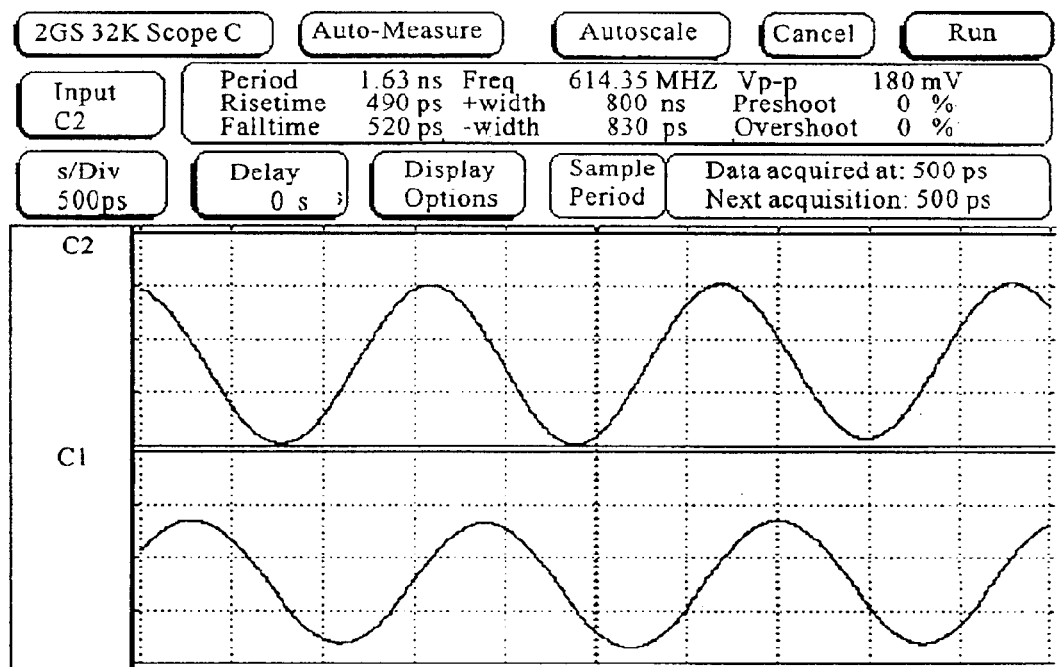
FIG. 15 schematically shows the measured waveforms of the oscillator having a 90° phase difference from the manufacture process of TSMC 0.35 um CMOS.

VLSI technology is used herein to implement the configuration of the present invention where the TSMC 0.35 um 1P4M and the UMC 0.5 um 2P2M CMOS are respectively applied in design, manufacture, and physical measurement, so that all the functionalities can be tested and proved. FIG. 14 schematically shows the output waveform of the oscillator having a 180° phase difference from the manufacture process of TSMC 0.35 um CMOS. When the supply voltage is 2.0V, the measured waveform frequency is 509 MHz. From FIG. 14, the phase difference of the output waveforms is 180° exactly. The measured waveforms of the proposed 90° phase difference oscillator are as shown in FIG. 15. FIG. 15 schematically shows the output waveforms of the oscillator having a 90° phase difference from the manufacture process of TSMC 0.35 um CMOS. As shown in the diagram, the 614 MHz output frequency of the designed circuit can be obtained. Therefore, the oscillator can precisely provide the 90° phase-difference oscillation signal outputs.

Figure 16:
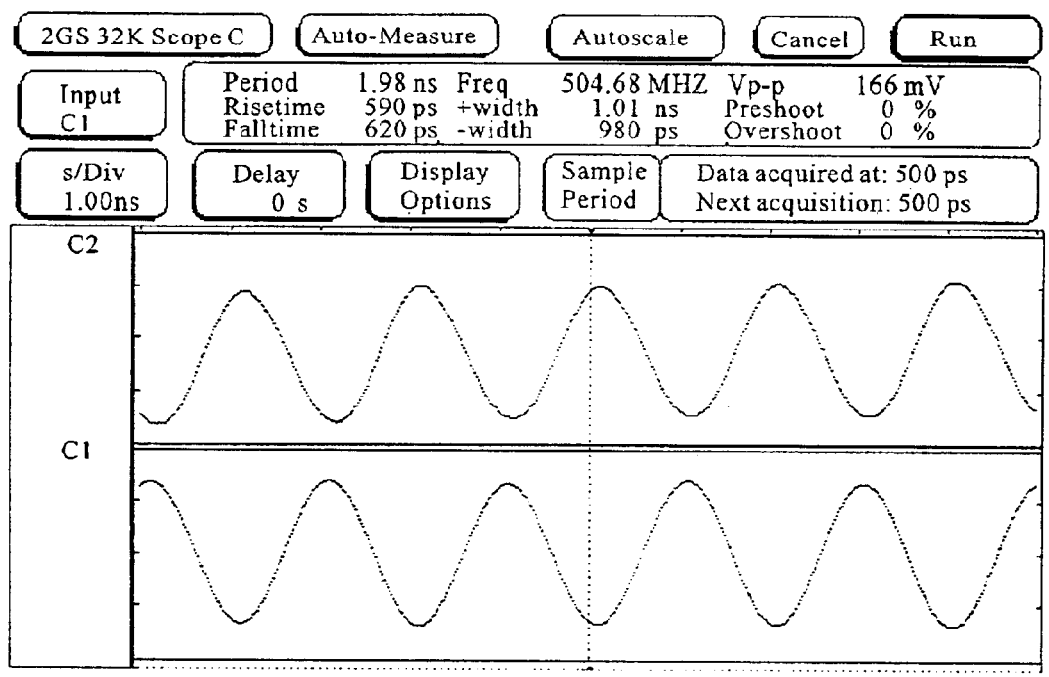
FIG. 16 schematically shows the measured waveforms of the oscillator having a 180° phase difference from the manufacture process of UMC 0.5 um CMOS.
Figure 17:
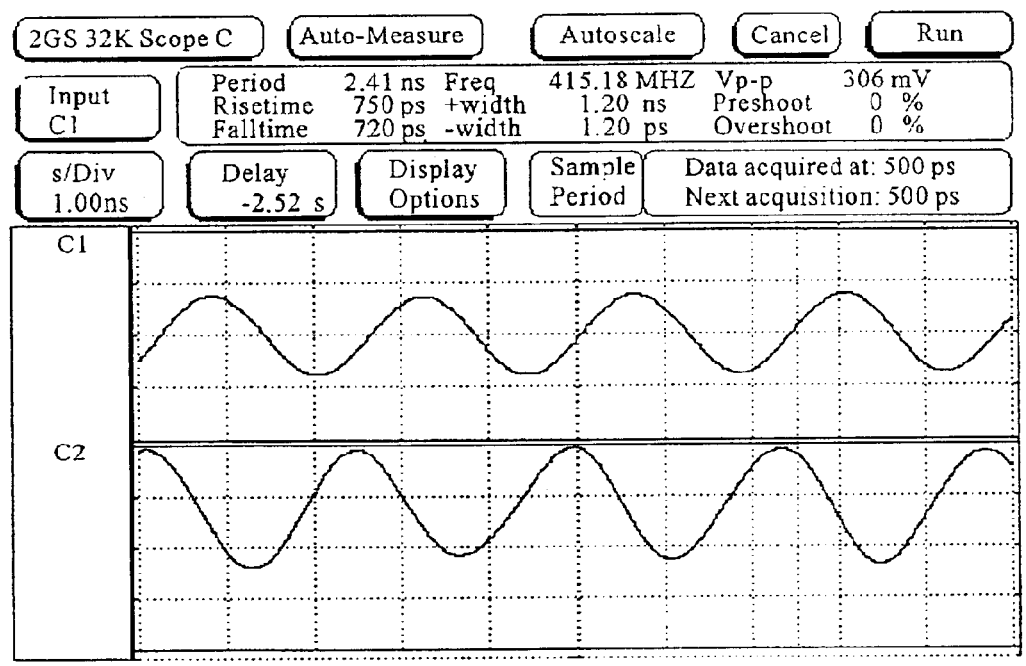
FIG. 17 schematically shows the measured waveforms of the oscillator having a 90° phase difference from the manufacture process of UMC 0.5 um CMOS.

As for the manufacture process of the UMC 0.5 um 2P2M CMOS, FIG. 16 schematically shows the measurement result of the oscillator having a 180° phase difference from the manufacture process of UMC 0.5 um CMOS. When the supply voltage is 2.0V, the measured output waveforms are as shown in FIG. 16, the operation frequency is 504 MHz, and the output waveforms of the oscillator exactly have a 180° phase difference. FIG. 17 schematically shows the measurement result of the oscillator having a 90° phase difference from the manufacture process of UMC 0.5 um CMOS. When the supply voltage is 2.0V, the frequency of the oscillation signal generated by the oscillator is 415 MHz.

From the simulation result and the measurement result mentioned above, the device provided by the present invention can achieve the function of outputting the multi-phase oscillation signals. Along with the usage of the more advanced semiconductor manufacture process, the frequency of the oscillation signal output from the present device can be increased, thus it is suitable for the variety of the radio frequency receiving systems to enhance the operating performance.

Therefore, the advantage of the present invention is to provide a new fashion 180° phase difference oscillator. It uses fewer elements, provides higher frequency and has less power consumption.

The other advantage of the present invention is to change the number of levels of the delay loop buffer to output the signal with any degree of the phase difference, so that the oscillator can generate and output the multi-phase oscillation signals.

The further advantage of the present invention is that there is a better isolation effect between the delay loop buffer and the oscillator to avoid the output mismatch, so that the quality of the oscillation signal output can be enhanced. Furthermore, the oscillator and the multiple-phase difference generation unit are totally independent, so that the oscillation frequency can be effectively maintained.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A multi-phase oscillator, comprising:

a delay loop buffer having N units of the delay unit that include a first delay unit, a second delay unit, . . . , a $N^{th}$ delay unit, wherein an output node of the first delay unit is electrically coupled to an input node of the second delay unit, an output node of the second delay unit is electrically coupled to an input node of the third delay unit, . . . , an output node of the $N^{th}$ delay unit is electrically coupled to an input node of the first delay unit, the N units of the delay unit constitute a mesh configuration having a 360° phase shift, the phase shift of every delay unit all equals to a value of 360° phase divided by N; and a plurality of oscillators, providing a plurality of oscillation signals to the delay loop buffer, by using the N units of the delay units to evenly divide a 360° phase to make the plural oscillation signals separately generated by the plural of oscillators have phases uniformly distributed in a 360° with fixed phase difference, wherein each delay unit further comprises:

a PMOS having a source, a gate and a drain, wherein the source of the PMOS is electrically coupled to a power supply, the gate of the PMOS is coupled to ground, the drain of the PMOS is electrically coupled to the output node of the delay unit; and a NMOS having a source, a gate and a drain, wherein the drain of the NMOS is electrically coupled to the output node of the delay unit, the gate of the NMOS is electrically coupled to the input node of the delay unit, the source of the NMOS is electrically coupled to one of the plural oscillators that is corresponded to the NMOS.

2. A multi-phase oscillator, comprising:

a delay loop buffer having N units of the delay unit that include a first delay unit, a second delay unit, ..., a $N^{th}$ delay unit, wherein an output node of the first delay unit is electrically coupled to an input of the second delay unit, an output node of the second delay unit is electrically coupled to an input node of the third delay unit, ..., an output node of the $N^{th}$ delay unit is electrically coupled to an input node of the first delay unit, the N units of the delay unit constitute a mesh configuration having a 360° phase shift, the phase shift of every delay unit all equals to a value of 360° phase divided by N; and a plurality of oscillators, providing a plurality of oscillation signals to the delay loop buffer, by using the N units of the delay units to evenly divide a 360° phase to make the plural oscillation signals separately generated by the plural of oscillators have phases uniformly distributed in a 360° with fixed phase difference, wherein each of the plural oscillators provides at least two oscillation signals, wherein each of the plural oscillators is a 180° phase difference oscillator having a first oscillation signal output node and a second oscillation signal output node, the first oscillation signal output node and the second oscillation signal output node of the 180° phase difference oscillator are electrically jointly coupled to the delay loop buffer, the 180° phase difference oscillator comprises:

a first inverter having an input node and an output node, wherein the output node of the first inverter is electrically coupled to the first oscillation signal output node;

a second inverter having an input node and an output node, wherein the input node of the second inverter is electrically coupled to the second oscillation signal output node, the output node of the second inverter is electrically coupled to the input node of the first inverter;

a third inverter having an input node and an output node, wherein the input node of the third inverter is electrically jointly coupled to the output node of the first inverter and the first oscillation signal output node;

a fourth inverter having an input node and an output node, wherein input node of the fourth inverter is electrically coupled to the output node of the third inverter, the output node of the fourth inverter is electrically jointly coupled to the input node of the second inverter and the second oscillation signal output node; and a regenerator having a first electrode and a second electrode, wherein the first electrode of the regenerator is electrically jointly coupled to the output node of the first inverter, the input node of the third inverter, and the first oscillation signal output node, the second electrode of the regenerator is electrically jointly coupled to the input node of the second inverter, the output node of the fourth inverter, and the second oscillation signal output node, the regenerator is used to generate a 180° phase difference on said first and second electrodes.

3. The multi-phase oscillator of claim 2, wherein the regenerator further comprises:

a fifth inverter having an input node and an output node, wherein the input node of the fifth inverter is electrically coupled to the first oscillation signal output node, the output node of the fifth inverter is electrically coupled to the second oscillation signal output node; and a sixth inverter having an input node and an output node, wherein the input node of the sixth inverter is electrically jointly coupled to the output node of the fifth inverter and the second oscillation signal output node, the output node of the sixth inverter is electrically jointly coupled to the input node of the fifth inverter and the first oscillation signal output node.

4. An oscillator yielding two output signals having a 180° phase difference, wherein the oscillator has a first oscillation signal output node and a second oscillation signal output node, the oscillator comprises:

a first inverter having an input node and an output node, wherein the output node of the first inverter is electrically coupled to the first oscillation signal output node;

a second inverter having an input node and an output node, wherein the input node of the second inverter is electrically coupled to the second oscillation signal output node, the output node of the second inverter is electrically coupled to the input node of the first inverter;

a third inverter having an input node and an output node, wherein the input node of the third inverter is electrically jointly coupled to the output node of the first inverter and the first oscillation signal output node;

a fourth inverter having an input node and an output node, wherein the input node of the fourth inverter is electrically coupled to the output node of the third inverter, the output node of the fourth inverter is electrically jointly coupled to the input node of the second inverter and the second oscillation signal output node; and a regenerator having a first electrode and a second electrode, wherein the first electrode of the regenerator is electrically jointly coupled to the output node of the first inverter, the input node of the third inverter, and the first oscillation signal output node, the second electrode of the regenerator is electrically jointly coupled to the input node of the second inverter, the output node of the fourth inverter, and the second oscillation signal output node, the regenerator is used to generate a 180° phase difference on said first and second electrodes.

5. The oscillator having a 180° phase difference of claim 4, wherein the regenerator further comprises:

a fifth inverter having an input node and an output node, wherein the input node of the fifth inverter is electrically coupled to the first oscillation signal output node, the output node of the fifth inverter is electrically coupled to the second oscillation signal output node; and a sixth inverter having an input node and an output node, wherein the input node of the sixth inverter is electrically jointly coupled to the output node of the fifth inverter and the second oscillation signal output node, the output node of the sixth inverter is electrically jointly coupled to the input node of the fifth inverter and the first oscillation signal output node.

6. A multi-phase oscillation signal generation method, comprising:

using a plurality of equal size delay times to divide a fixed phase into a plurality of the equal size portions that are corresponded to the plurality of the delay times; and using a plurality of the independent oscillation sources to separately provide a plurality of driving signals to the corresponding equal size portions to obtain fixed phase difference, wherein each of the plural oscillation sources provides the driving signals to more than two of the equal size portions simultaneously, wherein the driving signals output from any of the plural oscillation sources are generated by a of lower level oscillation sources.

7. The multi-phase oscillation signal generation method of claim 6, wherein the fixed phase is a 360° phase.

8. A multi-phase oscillation signal generation method, comprising:

using a plurality of equal size delay times to divide a fixed phase into a plurality of the equal size portions that are corresponding to the plurality of the delay times; and using a plurality of the independent oscillation sources to separately provide a plurality of driving signals to the corresponding equal size portions to obtain fixed phase difference, wherein each of the plural oscillation sources provides the driving signals to more than two of the equal size portions simultaneously, wherein the driving signals received by any of the plural equal size portions is generated by a multiple level configuration, in the multiple level configuration, the plural oscillation sources of a most upper level provide the oscillation signals to the plural corresponding equal size portions, and a plural lower-level oscillation sources also provide a signal that is to the upper level oscillation sources that provide signals to the next upper-level oscillation sources, repeating this hierarchical connections to reach the most upper-level oscillation sources.

9. The multi-phase oscillation signal generation method of claim 8, wherein the fixed phase is a 360° phase.

* * * * *